United States Patent
Lai et al.

(10) Patent No.: US 11,139,384 B2
(45) Date of Patent: Oct. 5, 2021

(54) METHOD FOR FABRICATING SEMICONDUCTOR DEVICE

(71) Applicant: UNITED MICROELECTRONICS CORP., Hsin-Chu (TW)

(72) Inventors: Kuo-Chih Lai, Tainan (TW); Yun-Tzu Chang, Kaohsiung (TW); Wei-Ming Hsiao, Tainan (TW); Nien-Ting Ho, Tainan (TW); Shih-Min Chou, Tainan (TW); Yang-Ju Lu, Changhua County (TW); Ching-Yun Chang, Yunlin County (TW); Yen-Chen Chen, Tainan (TW); Kuan-Chun Lin, Tainan (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/561,002

(22) Filed: Sep. 4, 2019

(65) Prior Publication Data
US 2020/0006514 A1    Jan. 2, 2020

Related U.S. Application Data

(62) Division of application No. 14/951,446, filed on Nov. 24, 2015, now Pat. No. 10,490,643.

(51) Int. Cl.
*H01L 29/43*    (2006.01)
*H01L 29/51*    (2006.01)
(Continued)

(52) U.S. Cl.
CPC .... *H01L 29/513* (2013.01); *H01L 21/823842* (2013.01); *H01L 29/401* (2013.01);
(Continued)

(58) Field of Classification Search
CPC . H01L 29/513; H01L 29/4966; H01L 29/401; H01L 29/517; H01L 29/66545;
(Continued)

(56) References Cited

U.S. PATENT DOCUMENTS 8,129,280 B2    3/2012  Wang
2007/0132004 A1   6/2007  Yasuda
(Continued)

OTHER PUBLICATIONS

Yang, Title of Invention: Semiconductor Device and Method for Fabricating the Same, U.S. Appl. N. 14/557,387, filed Dec. 1, 2014.
(Continued)

*Primary Examiner* — Samuel Park
(74) *Attorney, Agent, or Firm* — Winston Hsu

(57) ABSTRACT

A method for fabricating semiconductor device is disclosed. The method includes the steps of: providing a substrate having a first region, a second region, a third region, and a fourth region; forming a tuning layer on the second region; forming a first work function metal layer on the first region and the tuning layer of the second region; forming a second work function metal layer on the first region, the second region, and the fourth region; and forming a top barrier metal (TBM) layer on the first region, the second region, the third region, and the fourth region.

8 Claims, 4 Drawing Sheets

(51) Int. Cl.
*H01L 29/40* (2006.01)
*H01L 29/49* (2006.01)
*H01L 21/8238* (2006.01)
*H01L 21/84* (2006.01)
*H01L 27/12* (2006.01)

(52) U.S. Cl.
CPC ........ *H01L 29/4966* (2013.01); *H01L 29/517* (2013.01); *H01L 21/823821* (2013.01); *H01L 21/845* (2013.01); *H01L 27/1211* (2013.01)

(58) Field of Classification Search
CPC ............. H01L 21/823842; H01L 29/66; H01L 21/28088; H01L 21/823821; H01L 27/092; H01L 21/82345; H01L 27/0924; H01L 29/4958; H01L 29/66795; H01L 27/0922; H01L 29/7833; H01L 21/26513; H01L 21/823431; H01L 29/0649; H01L 29/518; H01L 29/6659; H01L 29/665; H01L 29/7848; H01L 29/785; H01L 21/424; H01L 29/49; H01L 21/82; H01L 27/09; H01L 29/78; H01L 21/26

See application file for complete search history.

(56) References Cited

U.S. PATENT DOCUMENTS

2014/0001543 A1    1/2014    Kim
2016/0126139 A1    5/2016    Yang
2017/0032972 A1*   2/2017    Tsai ................. H01L 21/28088

OTHER PUBLICATIONS

Chang, Title of Invention: Method for Modulating Work Function of Semiconductor Device Having Metal Gate Structure by Gas Treatment, U.S. Appl. No. 14/880,693, filed Oct. 12, 2015.

* cited by examiner

METHOD FOR FABRICATING SEMICONDUCTOR DEVICE

CROSS REFERENCE TO RELATED APPLICATIONS

This application is a division of U.S. application Ser. No. 14/951,446 filed Nov. 24, 2015, and incorporated herein by reference in its entirety.

BACKGROUND OF THE INVENTION

1. Field of the Invention

The invention relates to a method for fabricating metal gate transistor, and more particularly, to a method of using a tuning layer to form metal gate transistor with multi-threshold voltage (multi-vt) regions.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

Typically, threshold voltage in conventional planar metal gate transistors is adjusted by the means of ion implantation. With the trend in the industry being towards scaling down the size of the metal oxide semiconductor transistors (MOS), three-dimensional or non-planar transistor technology, such as fin field effect transistor technology (FinFET) has been developed to replace planar MOS transistors. Nevertheless, threshold voltages in current FinFET cannot be easily adjusted by using ion implantation. Hence, how to resolve this issue in today's FinFET architecture has become an important task in this field.

SUMMARY OF THE INVENTION

According to a preferred embodiment of the present invention, a method for fabricating semiconductor device is disclosed. The method includes the steps of: providing a substrate having a first region, a second region, a third region, and a fourth region; forming a tuning layer on the second region; forming a first work function metal layer on the first region and the tuning layer of the second region; forming a second work function metal layer on the first region, the second region, and the fourth region; and forming a top barrier metal (TBM) layer on the first region, the second region, the third region, and the fourth region.

According to another aspect of the present invention, a semiconductor device is disclosed. The semiconductor device includes: a substrate having a first region and a second region; a bottom barrier metal (BBM) layer on the first region and the second region; a tuning layer on the BBM layer of the second region; a first work function metal layer on the first region and the tuning layer of the second region; a second work function metal layer on the first work function metal layer of the first region and the second region; and a top barrier metal (TBM) layer on the second work function metal layer of the first region and the second region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
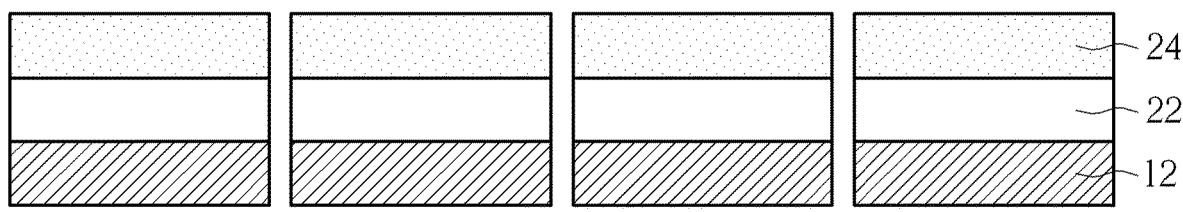
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a silicon substrate or silicon-on-insulator (SOI) substrate is provided, and regions 14, 16, 18, 20 are defined on the substrate 12. Preferably, the regions 14, 16 are composed of same conductive type and regions 18, 20 are composed of same conductive type, in which the regions 14, 16 in this embodiment are NMOS regions and regions 18, 20 are PMOS regions. More specifically, region 14 is a n-type medium-low threshold voltage (n-mlvt) region, region 16 is a n-type standard threshold voltage (n-svt) region, region 18 is a p-type standard threshold voltage (p-svt) region, and region 20 is a p-type medium-low threshold voltage (p-mlvt) region.

Next, depending on the type of transistor being fabricated, a fin-shaped structure (not shown) could be formed selectively on the substrate 12, and an insulating layer (not shown) could be formed on the substrate 12 to separate the regions 14, 16, 18, 20 and enclose the bottom of the fin-shaped structure to form a shallow trench isolation (STI).

Next, an interfacial layer (not shown) and a high-k dielectric layer (not shown) are deposited on the fin-shaped structure or substrate 12, and a bottom barrier metal (BBM) 22 and a tuning layer 24 are deposited on the high-k dielectric layer thereafter.

In this embodiment, the interfacial layer is preferably composed of nitrides, such as $SiO_2$, SiN, or SiON, or even high-k dielectric material, and the BBM layer 22 is composed of TaN, but not limited thereto.

The high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the tuning layer 24 is selected from the group consisting of TiN, TiAl, TiAlC, TaAl, and Al, and most preferably Al, in which the formation of the tuning layer 24 could be accomplished by either an atomic layer deposition (ALD) or a chemical vapor deposition (CVD) process. However, if the tuning layer 24 were to be composed of Al, it would be most desirable to deposit the Al tuning layer 24 on the layer underneath (such as a high-k dielectric layer) through an ALD process.

Figure 2:
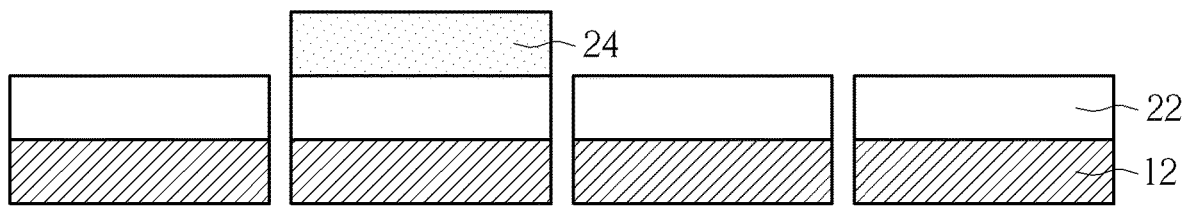

Next, as shown in FIG. 2, a photo-etching process could be conducted by first forming a patterned mask (not shown) on the region 16, and an etching process is conducted to remove the tuning layer 24 not covered by the patterned mask on regions 14, 18, 20 so that the BBM layer 22 on regions 14, 18, 20 is exposed and the remaining tuning layer 24 is only disposed on the BBM layer 22 of region 16.

Figure 3:
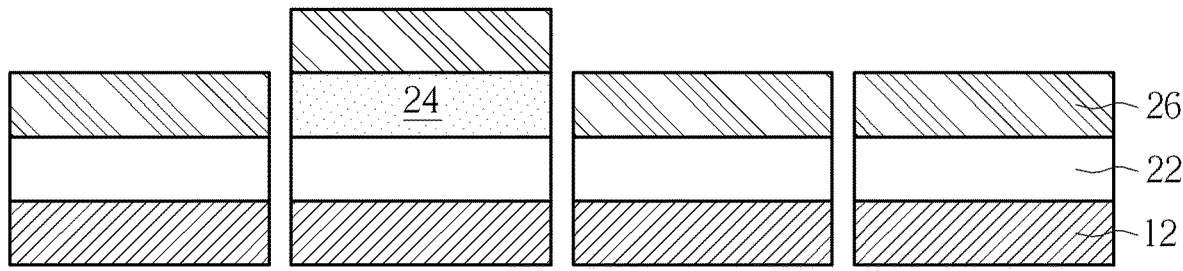
Figure 4:
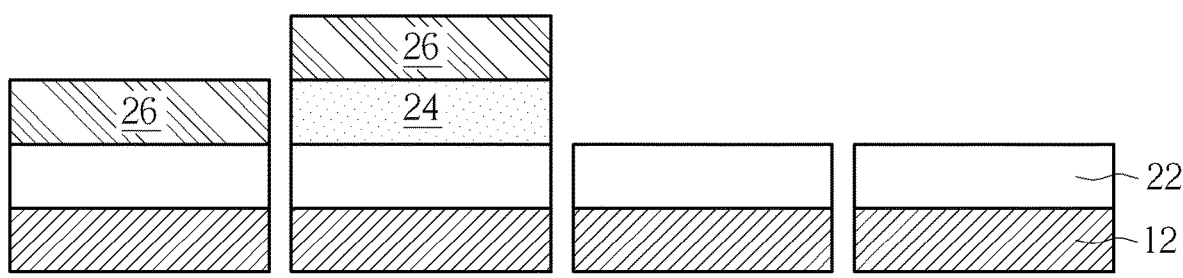

Next, as shown in FIG. 3, a work function metal layer 26 is deposited on regions 14, 16, 18, 20, or more specifically, on BBM layer 22 of regions 14, 18, 20 and the tuning layer 24 of region 16. Preferably, the work function metal layer 26 is a n-type work function metal layer having work function value ranging between 3.9 eV and 4.3 eV, which may be selected from the group consisting of titanium aluminide (TiAl), zirconium aluminide (ZrAl), tungsten aluminide (WAl), tantalum aluminide (TaAl), hafnium aluminide (HfAl), and titanium aluminum carbide (TiAlC), but not limited thereto Next, as shown in FIG. 4, another photo-etching process is conducted by forming a patterned mask (not shown) on regions 14 and 16, and an etching process is conducted to remove the work function metal layer 26 not covered by the patterned mask on regions 18 and 20 to expose the BBM layer 22 underneath.

Figure 5:
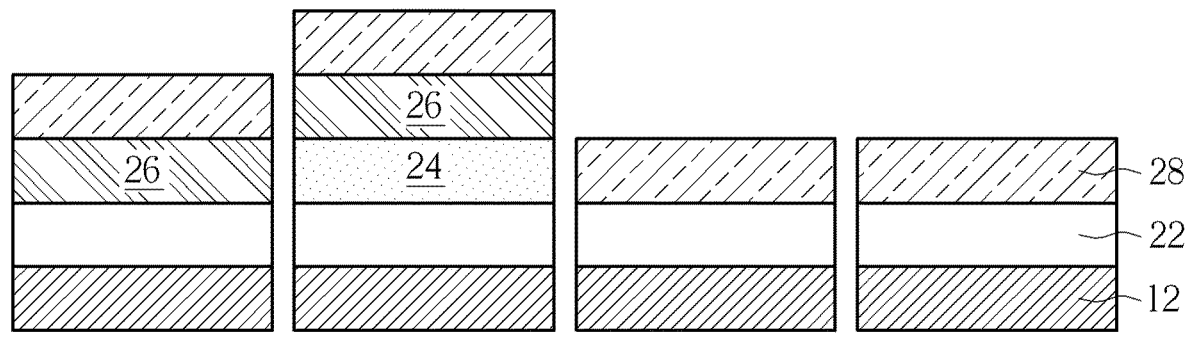

Next, as shown in FIG. 5, another work function metal layer 28 is deposited on regions 14, 16, 18, 20, or more specifically, on work function metal layer 26 of regions 14, 16 and BBM layer 22 of regions 18, 20. Preferably, the work function metal layer 28 is a p-type work function metal layer having work function value ranging between 4.8 eV and 5.2 eV, which may be selected from the group consisting of titanium nitride (TiN), tantalum nitride (TaN), and tantalum carbide (TaC), but not limited thereto.

Figure 6:
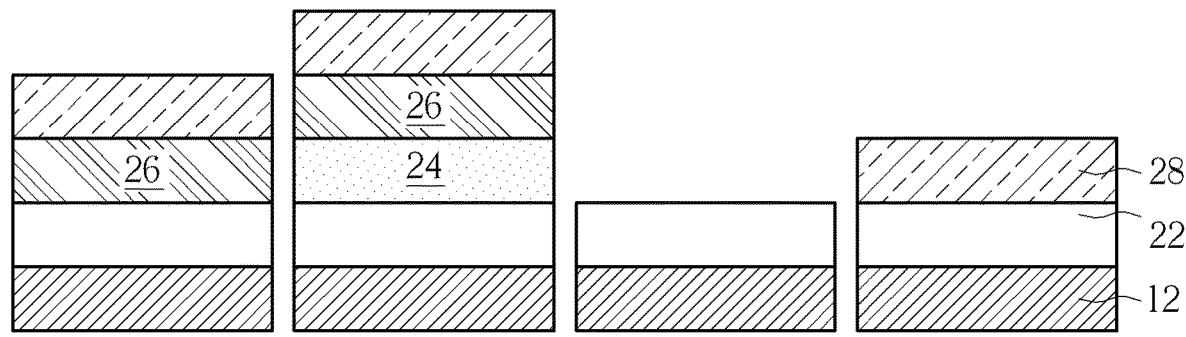

Next, as shown in FIG. 6 a photo-etching process is conducted by forming a patterned mask (not shown) on regions 14, 16, 20, and an etching process is conducted to remove the work function metal layer 28 not covered by the patterned mask on region 18 to expose the BBM layer 22 underneath.

Figure 7:
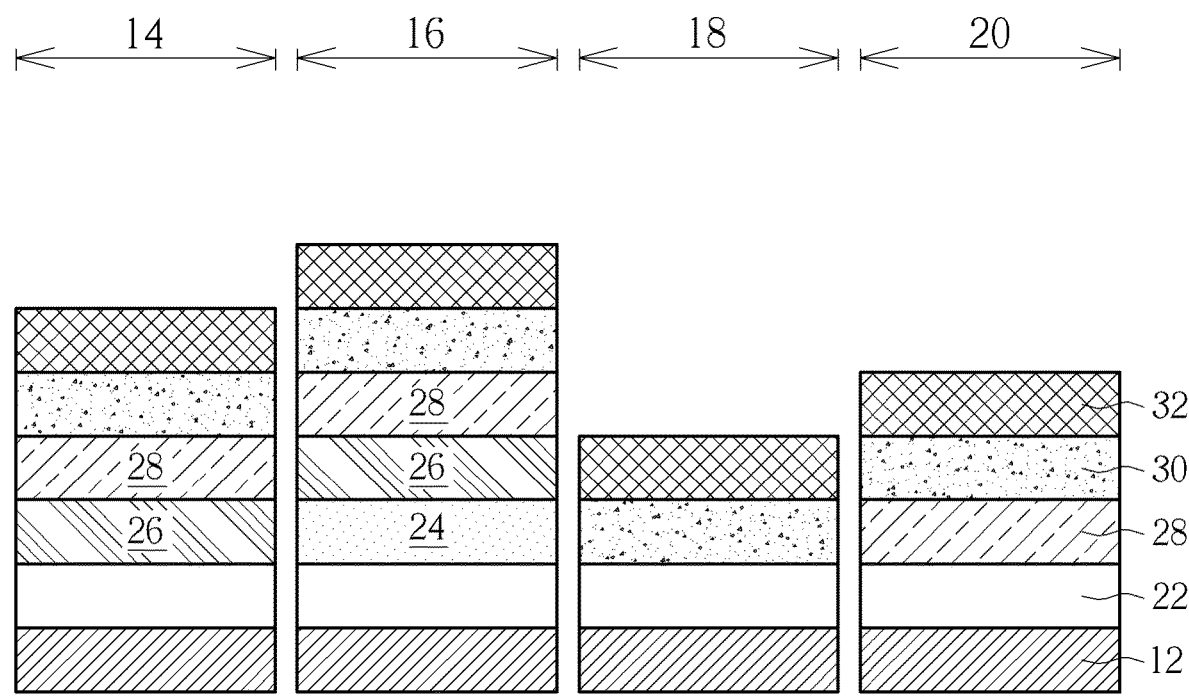

Next, as shown in FIG. 7, a top barrier metal (TBM) layer 30 is formed on regions 14, 16, 18, 20, or more specifically on the work function metal layer 28 of regions 14, 16, 20 and the BBM layer 22 on region 18. Preferably, the TBM layer 30 is composed of TiN, but not limited thereto. Next, a low resistance metal layer 32 selected from the group consisting of Cu, Al, W, TiAl, and CoWP is formed on the TBM layer 30 of the regions 14, 16, 18, 20. This completes the fabrication of a semiconductor device according to a preferred embodiment of the present invention.

Referring again to FIG. 7, which further illustrates a structural view of a semiconductor device according to a preferred embodiment of the present invention. As shown in FIG. 7, the semiconductor device includes a substrate 12 having regions 14, 16, 18, 20 defined thereon, a BBM layer 22 on the regions 14, 16, 18, 20, a tuning layer 24 on the BBM layer 22 of the region 16, a work function metal layer 26 on region 14 and the tuning layer 24 of region 16, another work function metal layer 28 on the work function metal layer 26 of regions 14, 16 and the BBM layer 22 on region 20, a TBM layer 30 on the BBM layer 22 of region 18 and work function metal layer 28 of regions 14, 16, 20, and a low resistance metal layer 32 on the TBM layer 30 of regions 14, 16, 18, 20.

Specifically, each of the layers formed on each of the regions 14, 16, 18, 20 preferably contact the layer underneath. Taking the layers on region 14 as an example, the BBM layer 22 on region 14 contacts a high-k dielectric layer (not shown) underneath, the work function metal layer 26 contacts the BBM layer 22 underneath directly, the work function metal layer 28 contacts the work function metal layer 26 underneath directly, the TBM layer 30 contacts the work function metal layer 28 directly, and the low resistance metal layer 32 contacts the TBM layer 30 directly.

Preferably, regions 14, 16 are transistor regions having same conductive type and regions 18, 20 are transistor regions having same conductive type, in which the regions 14, 16 are NMOS regions while regions 18, 20 are PMOS regions. More specifically, the region 14 is a n-type medium-low threshold voltage (n-mlvt) region, region 16 is a n-type standard threshold voltage (n-svt) region, region 18 is a p-type standard threshold voltage (p-svt) region, and region 20 is a p-type medium-low threshold voltage (p-mlvt) region.

In this embodiment, the BBM layer 22 is preferably composed of TaN, the tuning layer 24 is selected from the group consisting of TiN, TiAl, TiAlC, TaAl, and Al, the work function metal layer 26 is a n-type work function metal layer, the work function metal layer 28 is a p-type work function metal layer, and the TBM layer 30 is composed of TiN, but not limited thereto.

It is to be noted that the layers stacked on each of the regions 14, 16, 18, 20 constitute a metal gate. For instance, the layers 22, 26, 28, 30, 32 stacked on region 14 preferably constitute a n-mlvt gate, the layers 22, 24, 26, 28, 30, 32 stacked on region 16 preferably constitute a n-svt gate, the layers 22, 30, 32 stacked on region 18 preferably constitute a p-svt gate, and the layers 22, 28, 30, 32 stacked on region 20 constitute a p-mlvt gate.

It should be further noted that the fabrication of stacked layers disclosed in the aforementioned embodiments shown in FIG. 7 could all be applied to any stage of metal gate process, including gate first process, high-k first approach from gate last process, and high-k last approach from gate last process. For instance, if a high-k first approach were to be applied for fabricating metal gate of the present invention, the high-k dielectric layer would preferably include an I-shaped cross-section while the BBM layer, the tuning layer, the work function metal layers, and the TBM layer would have U-shaped cross-sections. If a high-k last approach were to be applied for fabricating metal gate of the present invention, the high-k dielectric layer would preferably include a U-shaped cross-section while the BBM layer, the tuning layer, the work function metal layers, and the TBM layer would also have U-shaped cross-sections. As all variations of metal gate process are well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:

providing a substrate having a first region, a second region, a third region, and a fourth region, wherein the second region is disposed between the first region and the third region;

forming a tuning layer on the second region, wherein the forming of the tuning layer on the second region comprises:

forming the tuning layer on the first region, the second region, the third region, and the fourth region;

removing the tuning layer on the first region, the third region, and the fourth region, wherein the tuning layer remains on the second region;

forming a first work function metal layer on the first region and the tuning layer of the second region;

forming a second work function metal layer on the first region, the second region, and the fourth region, wherein the forming of the second work function metal layer on the first region comprises:

forming the second work function metal layer on the first region, the second region, the third region, and the fourth region;

removing the second work function metal layer on the third region, wherein the second work function metal layer remains on the first region, the second region and the fourth region after the second work function metal layer on the third region is removed; and forming a top barrier metal (TBM) layer on the first region, the second region, the third region, and the fourth region.

2. The method of claim 1, further comprising:

forming a bottom barrier metal (BBM) on the substrate; wherein the forming of the first work function metal layer comprises:

forming the first work function metal layer on the first region, the second region, the third region, and the fourth region; and removing the first work function layer on the third region and the fourth region.

3. The method of claim 2, wherein the BBM layer comprises TaN.

4. The method of claim 1, wherein the first region and the second region comprise a same conductive type and the third region and the fourth region comprise a same conductive type.

5. The method of claim 4, wherein the conductive type of the first region and the second region comprise an n-type and the conductive type of the third region and the fourth region comprise a p-type.

6. The method of claim 1, wherein the tuning layer is selected from the group consisting of TiN, TiAl, TiAlC, and Al.

7. The method of claim 1, further comprising conducting an atomic layer deposition (ALD) for forming the tuning layer.

8. The method of claim 1, wherein the TBM layer comprises TiN.

* * * * *